(12) United States Patent
Myat et al.

(10) Patent No.: US 8,228,680 B2
(45) Date of Patent: Jul. 24, 2012

(54) EMBEDDING THIN FILM RESISTORS IN SUBSTRATES IN POWER DELIVERY NETWORKS

(75) Inventors: Myitzu Soe Myat, Penang (MY); Mooi Ling Chang, Kedah (MY); Eu Soon Lee, Kuala Lumpur (MY); Yongki Min, Phoenix, AZ (US); King Keong Wong, Kuala Lumpur (MY)

(73) Assignee: Intel Corporation, Santa Clara, CA (US)

( * ) Notice: Subject to any disclaimer, the term of this patent is extended or adjusted under 35 U.S.C. 154(b) by 110 days.

(21) Appl. No.: 12/699,939

(22) Filed: Feb. 4, 2010

(65) Prior Publication Data

US 2010/0134992 A1 Jun. 3, 2010

Related U.S. Application Data

(63) Continuation of application No. 11/168,175, filed on Jun. 28, 2005, now abandoned.

(51) Int. Cl.
*H05K 1/16* (2006.01)
(52) U.S. Cl. ........ 361/766; 361/763; 361/764; 361/794; 361/795
(58) Field of Classification Search .......... 361/763–766, 361/794–795; 333/12
See application file for complete search history.

(56) References Cited

U.S. PATENT DOCUMENTS

| 5,708,400 | A  * | 1/1998 | Morris ............................. 333/12 |
| 6,104,258 | A  * | 8/2000 | Novak .......................... 331/143 |
| 6,552,519 | B1 * | 4/2003 | Nazarian ........................ 323/354 |
| 6,806,569 | B2   | 10/2004 | Brisch et al. |
| 6,822,345 | B2   | 11/2004 | Gauthier et al. |
| 6,870,436 | B2 * | 3/2005 | Grebenkemper ............... 333/12 |
| 7,239,524 | B2 * | 7/2007 | Chung et al. ................... 361/760 |
| 2003/0085447 | A1 | 5/2003 | Duncombe et al. |

FOREIGN PATENT DOCUMENTS

| JP | 06-291258 | 10/1994 |
| JP | 10-200051 | 7/1998 |
| JP | 216340 | 4/2000 |
| JP | 222925 | 8/2002 |
| JP | 2004-023033 A | 1/2004 |
| TW | 511440 | 11/2002 |

OTHER PUBLICATIONS

International Search Report dated Oct. 27, 2006 issued in PCT/US06/026077 (6 pages).
International Preliminary Examination Report and Written Opinion dated Jan. 9, 2008, issued in PCT/US06/026077 (7 pages).
Office Action dated Oct. 4, 2011 issued by the Japanese Patent Office in corresponding Application No. 2008-512623 (4 pages).
Office Action dated May 28, 2008 issued by the Taiwan Patent Office in corresponding Application No. 95123374 (14 pages).

(Continued)

*Primary Examiner* — Tuan T Dinh
(74) *Attorney, Agent, or Firm* — Trop, Pruner & Hu, P.C.

(57) ABSTRACT

Using die side capacitors and embedded resistors, an advantageous power delivery network may be achieved. In some embodiments, the embedded resistors may be more precisely controllable. The number of die side capacitors may be reduced by combining embedded resistors with these capacitors to reduce costs. The embedded resistors may be provided within the metallization layers either at an upper layer or a lower layer, as two examples.

11 Claims, 6 Drawing Sheets

OTHER PUBLICATIONS

Office Action dated Aug. 17, 2011 issued by the Korean Intellectual Property Office in corresponding Application No. 10-2010-7019724 (7 pages).

Office Action dated Nov. 21, 2008 issued by the State Intellectual Properly Office of the People's Republic of China in corresponding Application No. 2006-80023059.6 (31 pages).

* cited by examiner

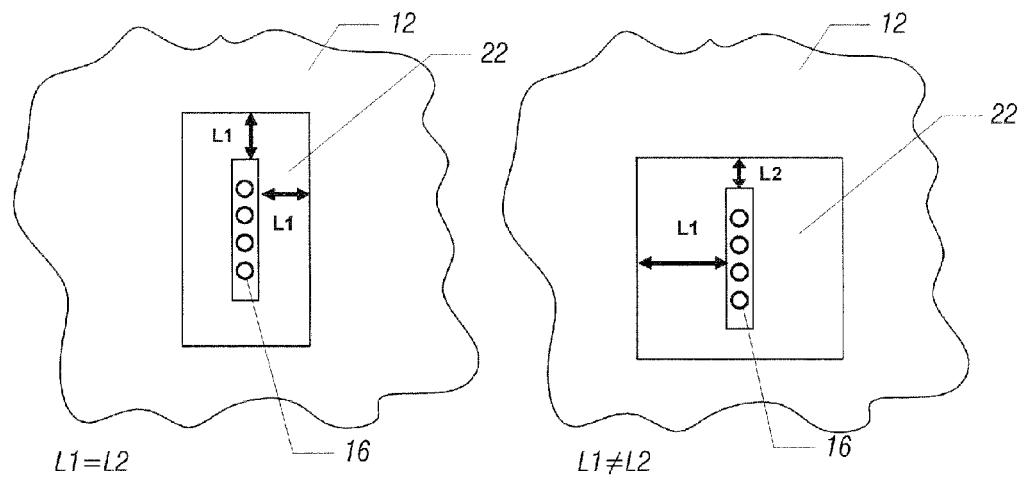
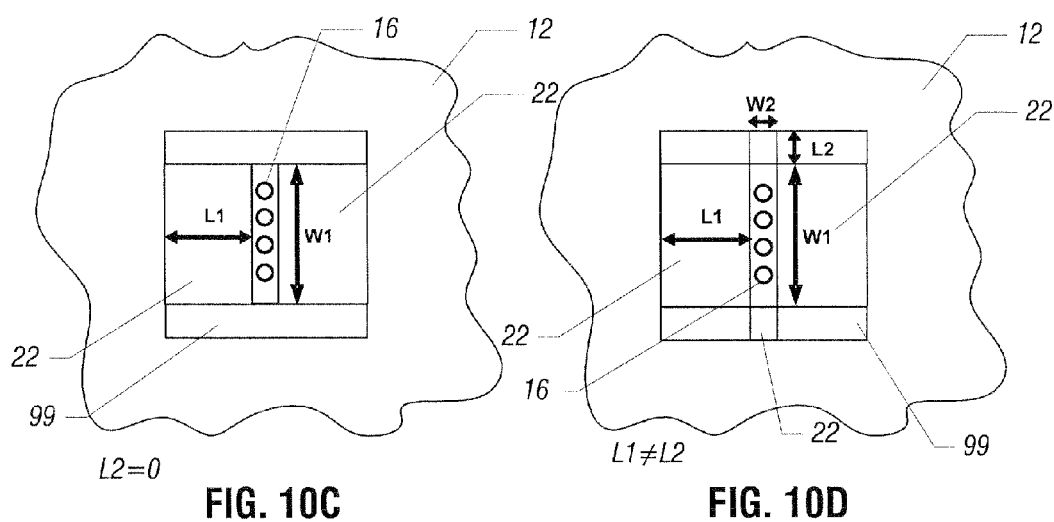
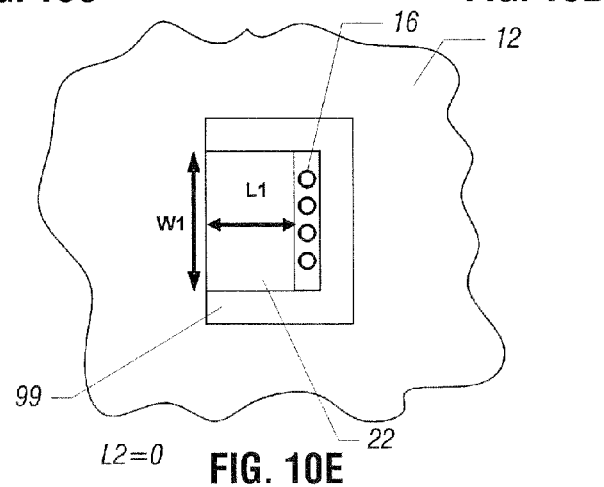
FIG. 10A  FIG. 10B  FIG. 10C  FIG. 10D  FIG. 10E

EMBEDDING THIN FILM RESISTORS IN SUBSTRATES IN POWER DELIVERY NETWORKS

CROSS-REFERENCE TO RELATED APPLICATIONS

This application is a continuation of U.S. patent application Ser. No. 11/168,175, filed on Jun. 28, 2005 now abandoned.

BACKGROUND

This invention relates generally to power delivery networks for integrated circuits.

A power delivery network supplies power from a power supply to an integrated circuit. Integrated circuits are typically assembled into packages that are mounted to a printed circuit board. The printed circuit board may be incorporated into an electronic subassembly that may be plugged into a motherboard or printed circuit board.

It is generally advantageous to have a semiconductor package and integrated circuit that is more efficient, having high decoupling capacitance and low inductance. To this end, power delivery networks may be designed with resistors and capacitors to reduce impedance and to increase the power transferred from the power supply to loads within the integrated circuit.

Thus, an overall goal of the power delivery network is to reduce the power loss of the integrated circuit and improve its performance. Advantageously, it does so at the lowest possible cost.

BRIEF DESCRIPTION OF THE DRAWINGS

FIGS. 10A-10E are partial, reduced, cross-sectional views taken generally along the line 7-7 in FIG. 6 in accordance with different embodiments of the present invention.

DETAILED DESCRIPTION

In accordance with some embodiments of the present invention, resistors may be embedded within integrated circuit metallization layers to implement a power delivery network that can be manufactured at lower cost. In addition, the embedded resistors may permit greater control over resistance values. In some embodiments, a resistor may be embedded within metallization layers and in other embodiments, the embedded resistor may be positioned atop the metallization layers.

Figure 1:
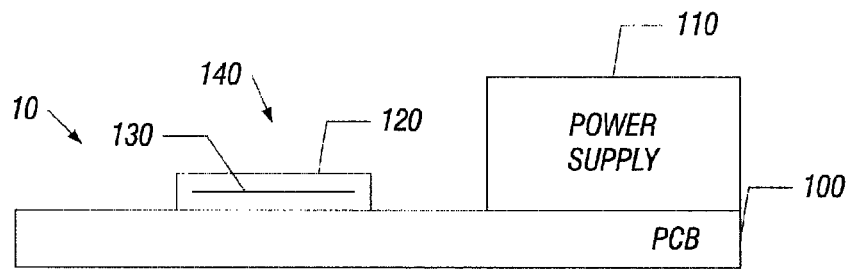
FIG. 1 is a schematic, cross-sectional view of one embodiment of the present invention.

Referring to FIG. 1, a power delivery network 10 may include a printed circuit board 100 on which is mounted a power supply 110. The power supply 110 supplies power through interconnections within the printed circuit board 100 to an integrated circuit 140 mounted on the printed circuit board 100. The integrated circuit 140 may include a package 120 and, within the package, a semiconductor die 130. In accordance with some embodiments of the present invention, the embedded resistor (not shown in FIG. 1) may be provided on the die 130.

Figure 2A:
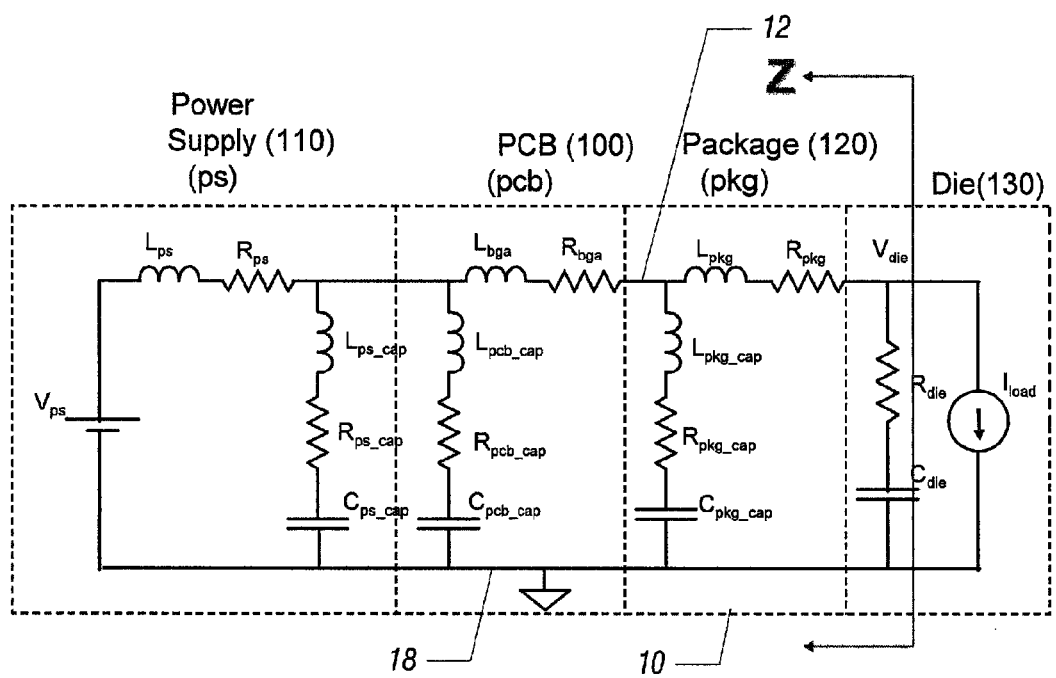
FIG. 2A is a simplified circuit diagram for the power delivery network of FIG. 1 in accordance with one embodiment of the present invention.

Thus, referring to FIG. 2A, a model depiction of the power delivery network 10 shows the power supply 110, supplying a potential called $V_{CC}$ on a power metallization line 12. Also, a ground metallization line 18 is indicated as supplying a potential called $V_{SS}$.

Figure 2B:
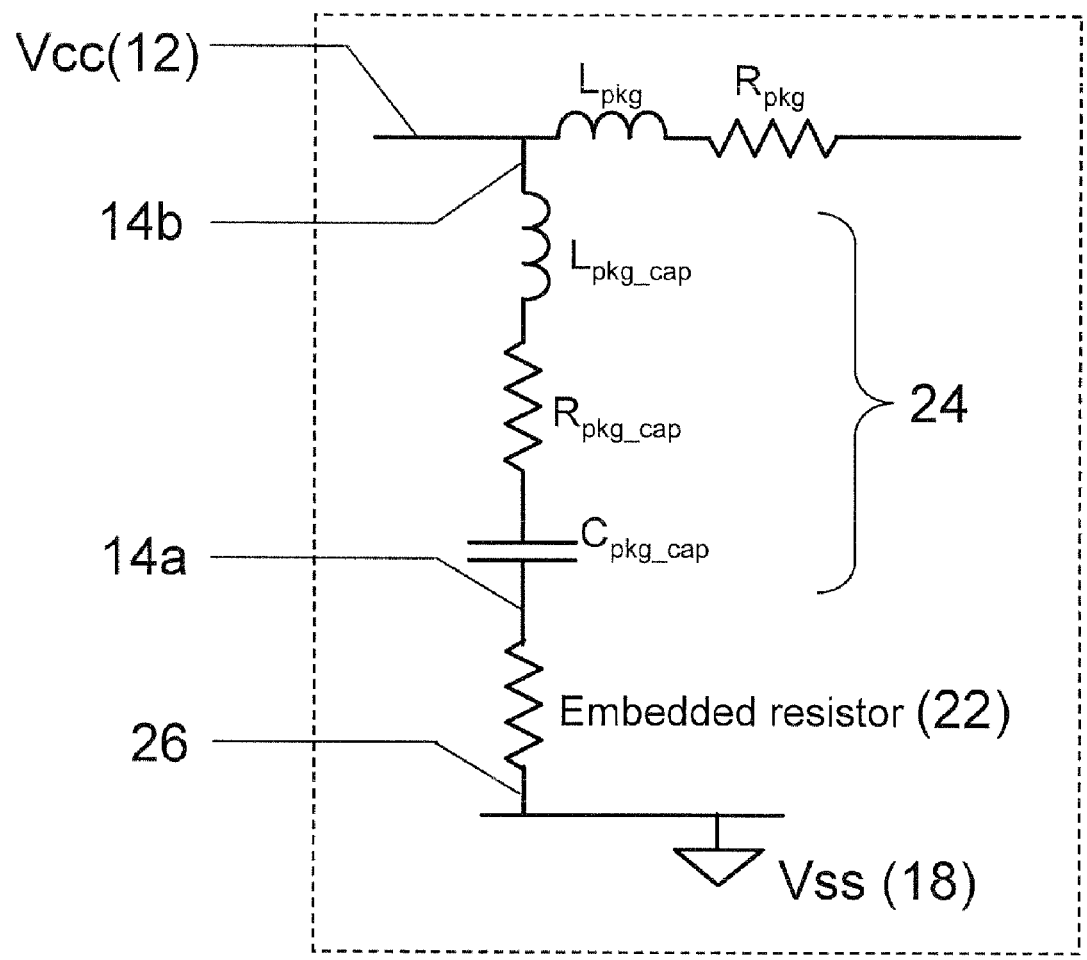
FIG. 2B is a more detailed circuit diagram for the package of FIG. 1 in accordance with one embodiment of the present invention.

As the die 130 capacitance ($C_{die}$) fully discharges to provide power to the die 130, the next capacitor to respond is the package capacitor (Cpkg_cap) 24 that has internal resistance (Rpkg_cap) and inductance (Lpkg_cap) (FIG. 2B). This package capacitor is connected to the package 120 via the pad 14b to Vcc metallization line 12. The other end of the capacitor is connected to the package 120 via pad 14a. The power discharge path of the capacitor 24 goes through embedded resistor 22.

In some embodiments, the embedded resistor may reduce the need to increase the on-die decoupling capacitance because the silicon cost itself is more than the substrate cost, mainly due to the high cost capital investments needed. Lowering the high frequency impedance may be driven by the embedded resistor, rather than the on-die capacitor in some embodiments.

The embedded resistor may be advantageous compared to high equivalent series resistance (ESR) capacitors since the embedded resistor allows custom-made resistance values needed in a capacitor. Available high ESR capacitors on the market may be made to specific resistance values with relatively limited choices, as their resistance is mainly due to changing the capacitor terminal resistance using specific high resistive materials.

With an embedded resistor, specific resistance values may be obtained by designing different physical dimensions of a thin film embedded resistor. In addition, the embedded resistor may allow for reduction in the number of capacitors, thereby reducing material and manufacturing costs.

Figure 3:
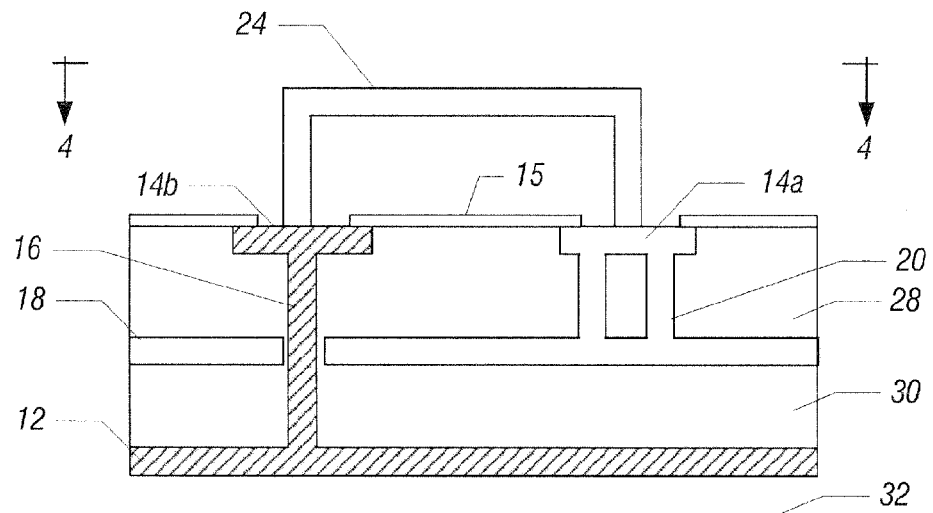
FIG. 3 is a partial, enlarged, cross-sectional view taken generally along the line 3-3 in FIG. 4.

The configuration of a portion of the integrated circuit die 130 that is pertinent to the power delivery network 10 is depicted in FIG. 3 in accordance with one embodiment of the present invention. Over a semiconductor substrate (not shown) may be one or more interlayer dielectrics 30, 32, and 28. Between the dielectrics 30 and 32, is the level 1 or power metallization line 12. Between the dielectrics 28 and 30, is the level 2 or ground metallization line 18. Finally, over the dielectric 28 may be metal pads 14b and 14a. A substantial portion of the upper surface of the structure may be covered by solder resist 15, in one embodiment, so that the capacitor 24 may be accurately positioned to land on the pads 14b and 14a.

Coupling the pad 14b to the power metallization line 12 is a via 16. In fact, a plurality of parallel vias 16 may be utilized to reduce effective resistance by providing parallel paths.

Thus, in one embodiment of the present invention, a plurality of the vias 16 may extend into the page, in FIG. 3, all connected to the pad 14b on one end and the power metallization line 12 on the lower end.

Similarly, as depicted on the right side in FIG. 3, a doubled via 20 may be provided between the pad 14a and the ground metallization line 18. While a doubled via 20 is illustrated, more than two parallel paths may be provided, again to reduce impedance by virtue of the parallel nature of the paths.

Thus, comparing FIGS. 2B and 3, the ground metallization line 18 is coupled, ultimately, to the power supply 110 and the capacitor 24, as well as the resistor 22. (The resistor 22 is not shown in FIG. 3).

Figure 4:
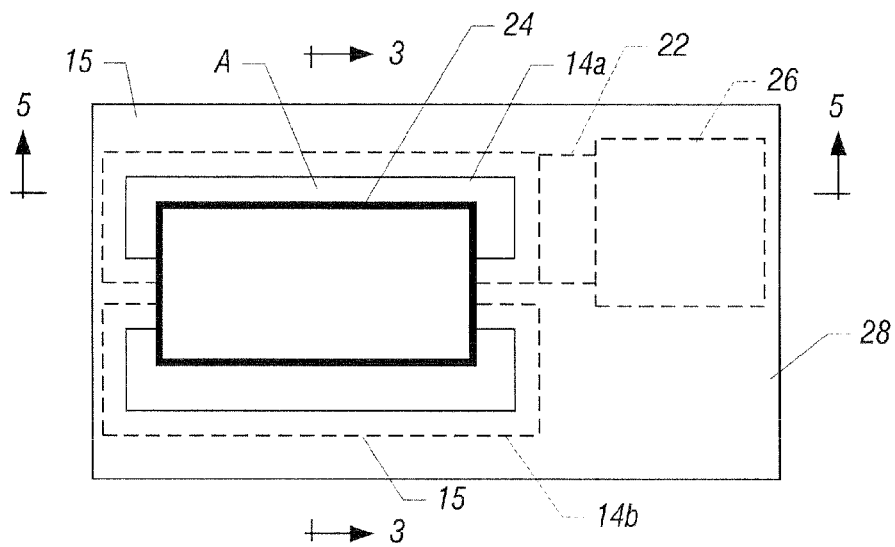
FIG. 4 is a top plan view of the embodiment shown in FIG. 3 in accordance with one embodiment of the present invention.

Referring to FIG. 4, which is a top plan view, the resistor 22 is hidden underneath a portion of the dielectric layer 28 and resist 15. The resistor 22 is electrically coupled between the Vss metallization pad 26 and the $V_{SS}$ pad 14a. The pad 14a is also partially covered by the solder resist 15. An exposed portion of the pad 14a is electrically coupled to the upper leg of the inverted U-shaped capacitor 24, while the exposed portion of the pad 14b is electrically coupled to the lower leg of the capacitor 24. The pad 14b may also be partially covered by resist 15. In the illustrated embodiment, the pad 26 couples to Vss, the pad 14a is coupled to $V_{SS}$, and the pad 14b is coupled to $V_{CC}$, all as further illustrated in FIGS. 3 and 5.

Figure 5:
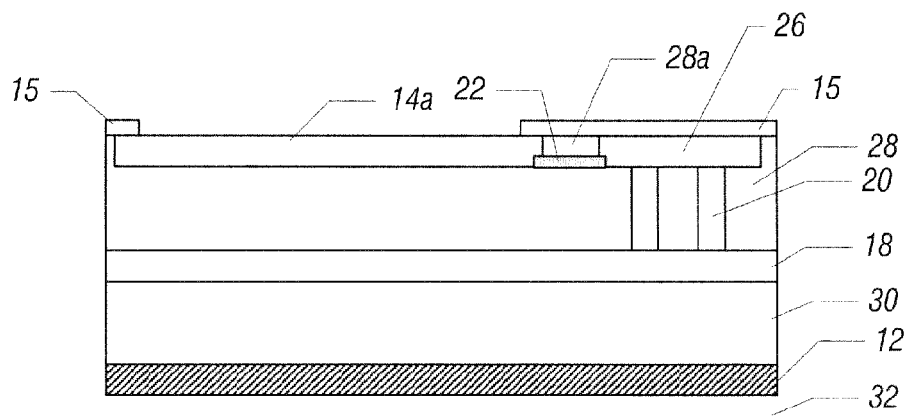
FIG. 5 is a cross-sectional view taken generally along the line 5-5 in FIG. 4 in accordance with one embodiment of the present invention.

Next, referring to FIG. 5, the pad 26 and the pad 14a are at least partially covered by the solder resist 15. Below the solder resist 15, adjacent the pads 26 and 14a, but at their lower extent, is the resistor 22. Effectively, the resistor 22 sits on and under the dielectric 28a. The pad 26 couples through doubled via 20 to the power metallization line 18. The dielectric 28a actually overlies the region between the resistor 22 and the solder resist 15.

Thus, an embedded resistor 22 and a die side capacitor (DSC) 24 may be provided in an integrated fashion on the die 130. The dimensions of a resistor 22 may be controllable to set a precise, desired resistance value in some embodiments. In some embodiments, a surface based resistor 22 may be advantageous because it may be more easily fabricated.

Figure 6:
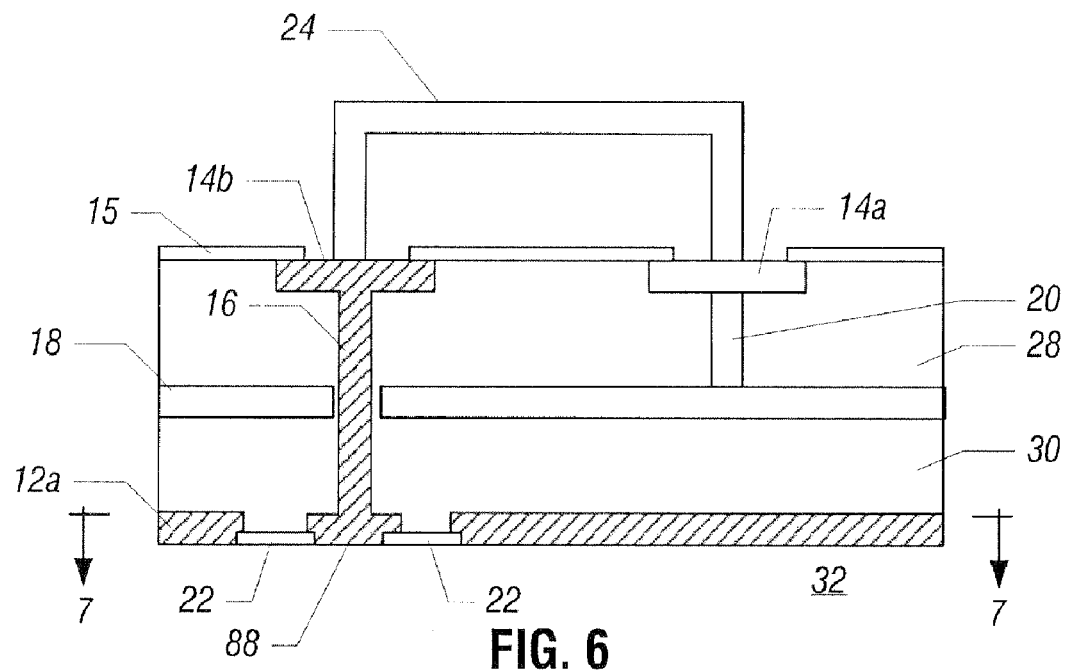
FIG. 6 is an enlarged, cross-sectional view of another embodiment of the present invention.
Figure 7:
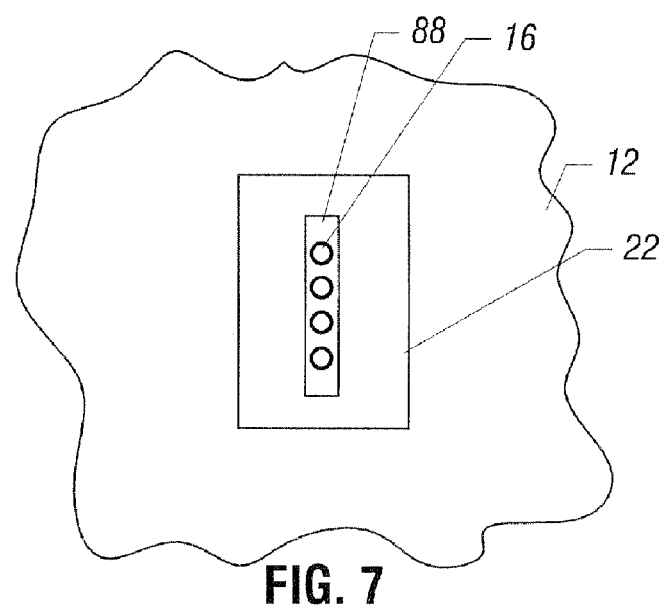
FIG. 7 is a partial, reduced, cross-sectional view taken generally along the line 7-7 in FIG. 6.

Referring to FIGS. 6 and 7, in accordance with another embodiment of the present invention, the resistor 22 may be embedded deeper within the structure shown in FIG. 6 and, in particular, in association with the power metallization line 12.

In particular, the line 12 may have an opening formed therein during fabrication. That opening may then be filled with the material that forms the resistor 22, which is patterned and etched to fall within, and slightly beyond, the opening so as to slightly overlap the line 12. For example, the line 12 and the line 18 are typically formed of copper. The resistor 22 may be formed of more resistive material, such as nickel. After the overlying dielectrics 28 and 30 are formed, a trench may be cut and filled with the via 16 which then, in turn, lands on top of a metal island layer 88 that electrically connects to the resistor 22. Otherwise, the structure is the same as that described in connection with the first embodiment.

Referring to FIG. 7, the resistor 22 amounts to an island within the line 12 in one embodiment. A plurality of parallel vias 16 may extend upwardly from metal island 88 that is surrounded by the resistor 22 to the pad 14b.

Thus, the current flow paths are determined by the length of the resistor 22 in the vertical and horizontal directions. By adjusting those lengths, the extent of resistance can be carefully controlled. Since photolithography may be utilized to define these lengths and widths of the resistor 22, the characteristics of the resistor 22 may be very precisely determined in some embodiments.

Figure 8:
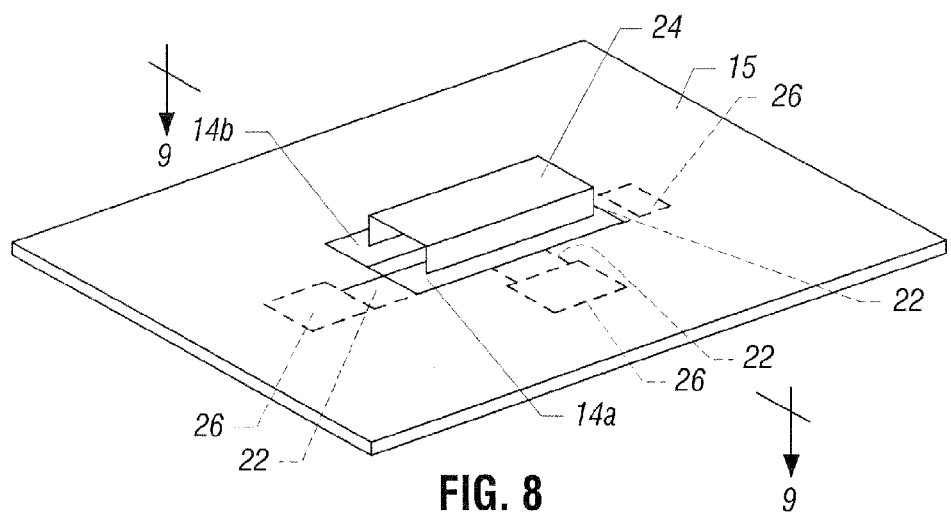
FIG. 8 is an enlarged, perspective view of still another embodiment of the present invention.
Figure 9:
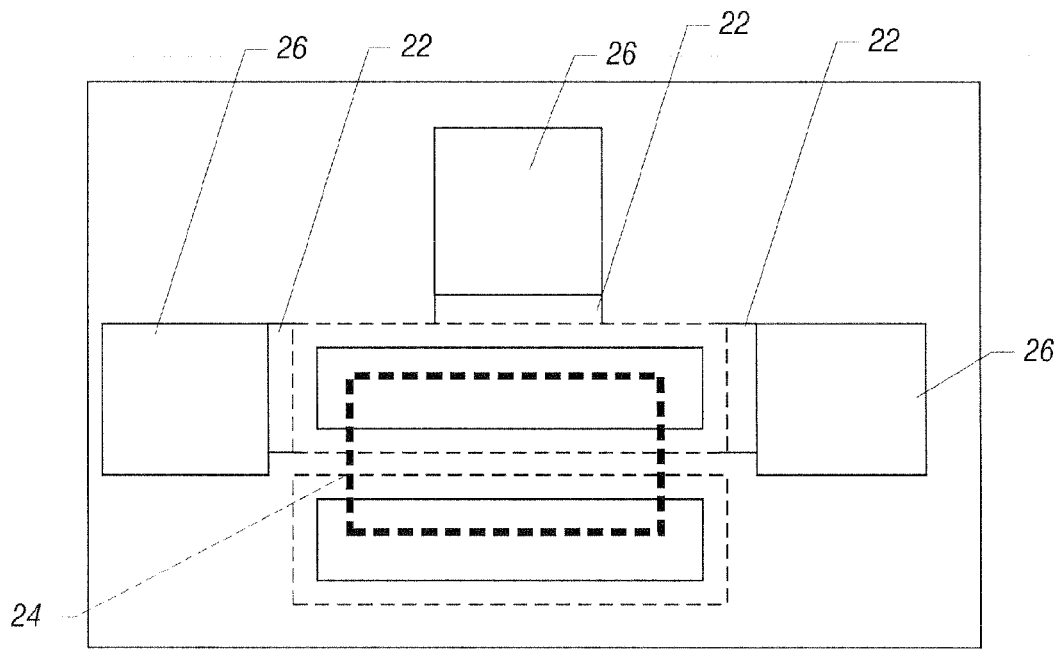
FIG. 9 is a planar, cross-sectional view of the embodiment shown in FIG. 8 taken generally along the line 9-9 in FIG. 8 in accordance with one embodiment of the present invention.

In accordance with a third embodiment of the present invention, shown in FIGS. 8 and 9, the arrangement of FIGS. 3-5 may be utilized. However, instead of only using a single pad 26 and a single resistor 22, a set of three such pads 26 and resistors 22 may be provided in such an embodiment. Thus, the pads 26 and resistors 22 may surround the pad 14a. However, the nature of the connections thereto and the arrangement of the pads 26 is precisely the same as described previously with respect to the single pad embodiment of FIGS. 3-5.

In some cases, the provision of multiple pads 26 and multiple parallel resistors 22 may reduce resistance, advantageously improving the performance of the interconnection network.

Finally, referring to FIGS. 10A-10E, a variety of embodiments use a resistor 22, associated with the line 12. They differ in the arrangement of the resistor 22 and, particularly, its dimensions relative to its contact with the metal island 88 coupled to the overlying vias 16.

More particularly, in the case of FIG. 10A, the dimensions L1 from the island 88 to the vertical and horizontal edges of the resistor 22 are equal lengths. Thus, the vertical length of the resistor 22, moving outwardly from the island 88 and the horizontal length, both illustrated as L1, can be virtually the same.

Referring to FIG. 10B, the length L1 and the horizontal length L2 are no longer equal. This length difference may be done by simply reshaping the resistor 22 during deposition and patterning.

Next, referring to FIG. 10C, the resistor 22 is connected to the island 88 on the left and right side of with the width of W1. On the top and bottom side of the island 88 and resistor 22 is an area filled with dielectric 99. This is to ensure the current flows through the resistor 22 on the left and right side from island 88 to metal 12, not the top and bottom.

FIG. 10D corresponds to FIG. 10C except that the resistor 22 does have a horizontal length L2 and width W2 that extends to the top and bottom of the island 88, but only in the region aligned with the point of contact with island 88. Thus, L1 may not equal L2 and W1 may not equal W2 in some embodiments of the present invention.

Finally, referring to FIG. 10E, the resistor 22 only extends upwardly away from its point of contact with the island 88. Thus, the resistor 22 has a dimension L1 and W1.

While FIGS. 10A-10E provide a limited number of examples of the resistor 22 variations that may be provided, those skilled in the art will appreciate numerous other variations. It should be appreciated then that the resistance of the resistor 22 may be precisely controlled by providing any number of arrangements of resistor 22 shape, size, and number.

In accordance with some embodiments of the present invention, the resistor 22 may have a thickness of about 0.1 microns and a conductivity of $4.9 \times 10^6$ S/m. It may, for example, have a resistivity between 100 and 200 Ohms in some embodiments. Several capacitors 24 may be used having dimensions of 40×20 mils. In one embodiment, four capacitors 24 may be used, representing a reduction in the number of capacitors. Moreover, the capacitors 24 may be die side capacitors (DSCs), as opposed to interdigitized capacitors (IDCs). The embedded resistor may be designed for other form factor two terminal capacitors and also IDC capacitors.

In some embodiments, providing the resistance within the substrate enables lower cost two terminal capacitors to replace interdigitized capacitors. This replacement may result in a cost reduction of up to 60% or more in some cases. In addition, the number of capacitors may be reduced in some embodiments.

The objective of a power delivery network 10 is generally to ensure maximum power transfer from the power regulator to the integrated circuit through the network path. This may be achieved by ensuring the lowest impedance (Z) of the power delivery network path since the power is equal to the square of the applied voltage over the impedance. The simplified resonance impedance ($Z_0$) of FIG. 2A is provided by $Z_0$ being equal to the inductance divided by the product of the capacitance and the resistance. The capacitance can be represented by an on die decoupling capacitance, while the inductance and resistance represent the inductance and resistance of discrete decoupling capacitors, including package or motherboard capacitors.

The simplified resonance impedance $Z_0$ can be lowered by increasing the on-die capacitance, increasing the resistance of the discrete decoupling capacitors or lowering or maintaining the inductance of the decoupling capacitors. In accordance with some embodiments of the present invention, the resistance of the power delivery network 10 may be increased by embedding resistors 22 in discrete capacitor routing, either on the surface of the substrate or in inner layers of the substrate, while maintaining low inductance. The embedded resistance may be controlled by designing it with specific dimensions in the length, width, and thickness dimensions. Generally, the resistance of the resistor needed for capacitor routing is from 100 mOhm to 1 Ohm.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a packaged integrated circuit including an integrated circuit and an integrated circuit package packaging said circuit within said package, said package having a capacitance;
an electrical connection from said package to the integrated circuit within said package; and
an integrated resistor integrated into said integrated circuit, said resistor coupled to said package capacitance by said electrical connection, said resistor in series with said package capacitance in a power discharge path of said capacitance to ground; and
a decoupling capacitor that is U-shaped and includes a pair of downwardly extending legs and lands to electrically contact said legs.

2. The apparatus of claim 1 including at least two metallization layers, said resistor being positioned between the upper of said metallization layers.

3. The apparatus of claim 1 including at least two metallization layers, said resistor being associated with the lower of said metallization layers.

4. The apparatus of claim 1 including a pad spaced from one of said lands, said resistor being situated electrically between said pad and one of said lands.

5. The apparatus of claim 3 wherein one of said metallizations is a power supply metallization, said power supply metallization having an opening, said resistor being formed in said opening.

6. The apparatus of claim 4 wherein said resistor is coupled through said pad to a power supply metallization.

7. The apparatus of claim 5 wherein said resistor is coupled to said capacitor, said capacitor being U-shaped and sitting on two spaced pads, one of said pads being coupled by a via to said power supply metallization.

8. The apparatus of claim 7 including a plurality of vias extending from said resistor to a pad coupled to said capacitor.

9. An apparatus comprising:
a packaged integrated circuit including an integrated circuit and an integrated circuit package packaging said circuit within said package, said package having a capacitance;
an electrical connection from said package to the integrated circuit within said package; and
an integrated resistor integrated into said integrated circuit, said resistor coupled to said package capacitance by said electrical connection, said resistor in series with said package capacitance in a power discharge path of said capacitance to ground;
at least two metallization layers, said resistor being associated with the lower of said metallization layers; and
wherein one of said metallizations is a power supply metallization, said power supply metallization having an opening, said resistor being formed in said opening.

10. The apparatus of claim 9 wherein said resistor is coupled to said capacitor, said capacitor being U-shaped and sitting on two spaced pads, one of said pads being coupled by a via to said power supply metallization.

11. The apparatus of claim 10 including a plurality of vias extending from said resistor to a pad coupled to said capacitor.

* * * * *